United States Patent
Biegelsen et al.

(10) Patent No.: US 10,186,776 B2
(45) Date of Patent: Jan. 22, 2019

(54) RECTIFYING DEVICES AND FABRICATION METHODS

(71) Applicant: Palo Alto Research Center Incorporated, Palo Alto, CA (US)

(72) Inventors: David K. Biegelsen, Portola Valley, CA (US); JengPing Lu, Fremont, CA (US); Janos Veres, San Jose, CA (US)

(73) Assignee: Palo Alto Research Center Incorporated, Palo Alto, CA (US)

( * ) Notice: Subject to any disclaimer, the term of this patent is extended or adjusted under 35 U.S.C. 154(b) by 0 days.

(21) Appl. No.: 16/005,049

(22) Filed: Jun. 11, 2018

(65) Prior Publication Data
US 2018/0309200 A1    Oct. 25, 2018

Related U.S. Application Data

(62) Division of application No. 15/491,546, filed on Apr. 19, 2017, now Pat. No. 9,997,837.

(51) Int. Cl.
| H01L 31/09 | (2006.01) |
| H01Q 9/04 | (2006.01) |
| H01L 31/18 | (2006.01) |

(52) U.S. Cl.
CPC ........... *H01Q 9/0407* (2013.01); *H01L 31/09* (2013.01); *H01L 31/18* (2013.01)

(58) Field of Classification Search
None
See application file for complete search history.

(56) References Cited

U.S. PATENT DOCUMENTS

| 7,786,670 | B2 | 8/2010 | Veres et al. |
| 8,222,077 | B2 | 7/2012 | Gong et al. |
| 9,413,063 | B1 | 8/2016 | Apostolos et al. |
| 2006/0207647 | A1 | 9/2006 | Tsakalakos et al. |
| 2008/0169464 | A1 | 7/2008 | Gong et al. |
| 2016/0233371 | A1 | 8/2016 | Apostolos et al. |

OTHER PUBLICATIONS

Chin et al., "Metal-Insulator-Metal Diode Process Development for Energy Harvesting Applications", Army Research Laboratory, Apr. 2010, 30 pages. (Year: 2010).*
Chin et al., "Metal-Insulator-Metal Diode Process Development for Energy Harvesting Applications", Army Research Laboratory, Apr. 2010, 30 pages.
Choi et al., "A Focused Asymmetric Metal-Insulator-Metal Tunneling Diode: Fabrication, DC Characteristics and RF Rectification Analysis", IEEE Transactions on Electron Devices, vol. 58, No. 10, Oct. 2011, 10 pages.

(Continued)

*Primary Examiner* — Daniel P Shook
(74) *Attorney, Agent, or Firm* — Hollingswoth Davis, LLC

(57) ABSTRACT

A method of forming an electronic field emission rectifier involves depositing a first metal layer, a dielectric, and a second metal layer on a substrate in that order. The dielectric layer and the second metal layer are patterned. Patterning the dielectric and second metal layers involves depositing a nanostructuring layer on the second metal layer. The nanostructuring layer self-assembles into removable regions embedded within a matrix. When the removable regions are removed, a pattern is formed in the matrix.

15 Claims, 8 Drawing Sheets

(56) References Cited

OTHER PUBLICATIONS

Grover et al., "Applicability of Metal/Insulator/Metal (MIM) Diodes to Solar Rectennas", IEEE Journal of Photovoltaics, vol. 1, No. 1, Jul. 2011, 6 pages.

Li, "Study of Metal-Insulator-Metal Diodes for Photodetection", May 2013, 105 pages.

Ratnadurai, "Development of a Reliable Metal-Insulator-Metal Bilayer Tunnel Junction for Wideband Detectors", Jan. 2012, 153 pages.

* cited by examiner

RECTIFYING DEVICES AND FABRICATION METHODS

RELATED PATENT DOCUMENTS

This application is a divisional of U.S. application Ser. No. 15/491,546, filed Apr. 19, 2017, to which priority is claimed and which is incorporated herein by reference in its entirety.

TECHNICAL FIELD

This disclosure relates generally to rectifying devices and to fabrication methods for such devices.

BACKGROUND

A variety of applications employ high-speed rectification. One such application involves rectifying microwave antenna arrays. Rectifying antennas, or "rectennas," comprise a rectifier coupled to an antenna. The antenna produces AC current in response to an electromagnetic signal and the rectifier converts the AC current produced by the antenna to DC current. Rectennas have been proposed for a number of implementations, ranging from harvesting solar energy from space to powering small electronic devices.

BRIEF SUMMARY

Some embodiments involve a method of forming an electronic field emission rectifier. According to the method, a first metal layer having a peripheral edge is disposed on a substrate. A dielectric layer is disposed on the first metal layer and a second metal layer is disposed on the dielectric layer. The dielectric layer and the second metal layer are patterned. Patterning the dielectric and second metal layers involves depositing a nanostructuring layer on the second metal layer. The nanostructuring layer self-assembles into removable regions embedded within a matrix. When the removable regions are removed, a pattern is formed in the matrix.

Some embodiments are directed to an electronic field emission rectifier that includes a first metal layer—insulator—second metal layer sandwich disposed in that order on a substrate. The insulator and second metal layers are patterned in such as way that the pattern produces one or more edges of the dielectric and second metal layers. A total length of the one or more edges of the dielectric and second metal layers is at least about 50% greater than a length of the peripheral edge of the first metal layer.

These and other aspects of the present application will be apparent from the detailed description below. In no event, however, should the above summaries be construed as limitations on the claimed subject matter, which subject matter is defined solely by the attached claims.

BRIEF DESCRIPTION OF DRAWINGS

The figures are not necessarily to scale. Like numbers used in the figures refer to like components. However, it will be understood that the use of a number to refer to a component in a given figure is not intended to limit the component in another figure labeled with the same number.

DETAILED DESCRIPTION OF ILLUSTRATIVE EMBODIMENTS

Embodiments disclosed herein relate to vertical field emission rectifier diodes that can be patterned by printing. Printing-based patterning is desirable for large area fabrication including roll-to-roll processing. Printing fabrication of some high-speed rectifiers presents challenges because the rectifiers involve short device spatial scales and provide high currents. The disclosed approaches enable the formation of spatially small, inexpensive, high current rectifiers that are useful for many applications.

Figure 1A:
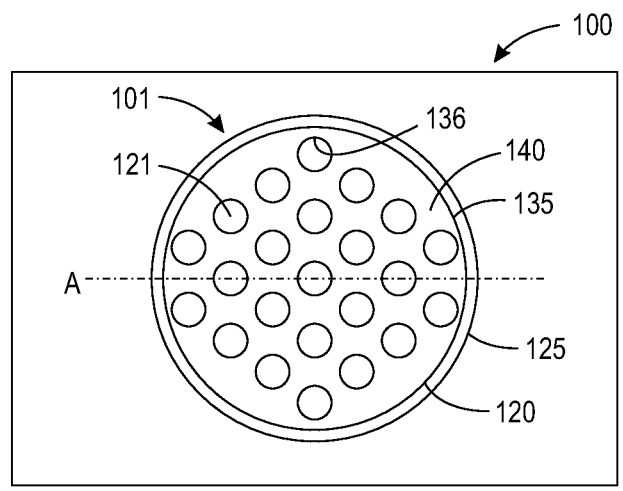
FIGS. 1A and 1B respectively show top and cross sectional views of an electronic field emission rectifier having a "holey" nanostructure in accordance with some embodiments.
Figure 1B:
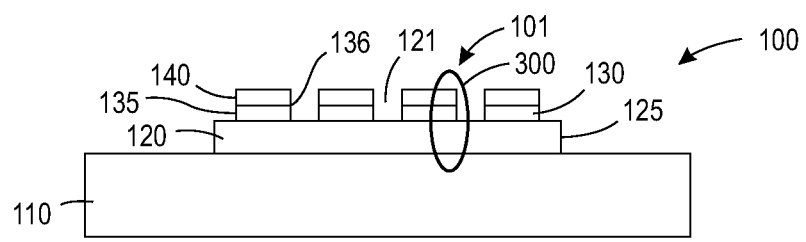

FIGS. 1A and 1B respectively show top and cross sectional views of an electronic field emission rectifier 100 in accordance with some embodiments. The rectifier 100 includes a substrate 110 having a first metal layer 120 disposed thereon. The first metal layer 120 has an outer peripheral edge 125 also referred to herein as a "boundary." A patterned dielectric layer 130 is disposed on the first metal layer 120. A patterned second metal layer 140 is disposed on the dielectric layer 130 such that the dielectric layer 130 is sandwiched between the first metal layer 120 and the second metal layer 140.

As shown in FIGS. 1A and 1B, at least in the rectifying region 101 of the field emission rectifier 100, the second metal layer 140 may have substantially the same pattern as the dielectric layer 130. The pattern of the dielectric layer 130 and the second metal layer 140 produces one or more edges 135, 136 of the dielectric layer 130 and the second metal layer 140. Electric field emission that occurs at the edges 135, 136 of the second metal layer 140 provides high current across the short distance set by the thickness of the relatively thin dielectric layer 130. In some implementations, the field emission current is proportional to the total length of the edges 135, 136 of the second metal layer 140. The total length of the edges of the second metal layer is the sum of the length of the outer peripheral edge 135 added to the lengths of each of the inner edges 136. In various configurations, the total length of the one or more edges 135, 136 is at least about 50%, at least about 75%, at least about 100%, at least about 150%, or even at least about 200% greater than the length of the peripheral edge 125 of the first metal layer 120.

As indicated in FIGS. 1A and 1B, in some embodiments, the edges 135, 136 of the patterned dielectric 130 and second metal 140 layers include at least one outer peripheral edge 135 and multiple discrete edges 136 that lie within the outer peripheral edge 135. In some embodiments, the one or more discrete inner edges 136 define one of more discrete openings 121 through the dielectric layer 130 and the second metal layer 140 down to the first metal layer 120.

In FIGS. 1A and 1B, the openings 121 are illustrated as being substantially circular. The discrete openings 121 may be formed in any convenient shape, such as circles (as shown in FIGS. 1A and 1B), polygons, triangles, squares, rectangles, pentagons, hexagons, star-shape, L-shape, U-shape, E-shape, etc. In various embodiments, each of the openings may have an area of less than about 10 μm. For example, the substantially circular regions 121 shown in FIGS. 1A and 1B may have an average diameter of less than about 100 nm. According to some embodiments, the total surface area of the first metal layer 120 can be at least 50% greater than a total surface area of the second metal layer 140.

The rectifier 100 includes macrostructures generally having micron-scale or greater dimensions such as the rectifier leads (not shown in FIGS. 1A and 1B) and outer dimensions of the first metal layer 120, dielectric layer 130, and second metal layer 140. The rectifier 100 includes nanostructures that are relatively small compared to the macrostructures, such as the discrete openings 121.

Figure 2A:
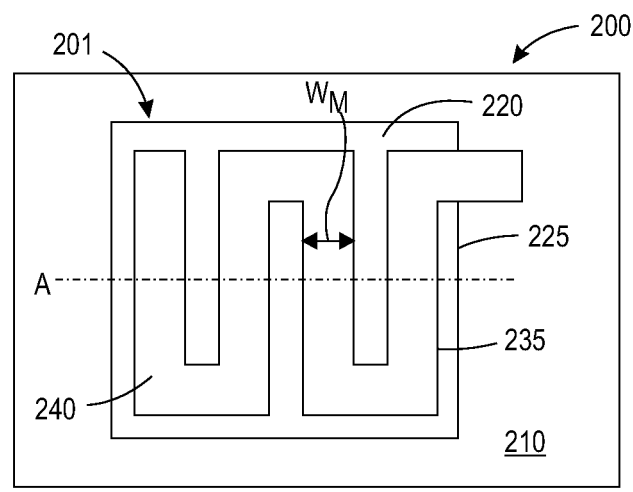
FIGS. 2A and 2B respectively show top and cross sectional views of an electronic field emission rectifier having a meandering nanostructure in accordance with some embodiments.
Figure 2B:
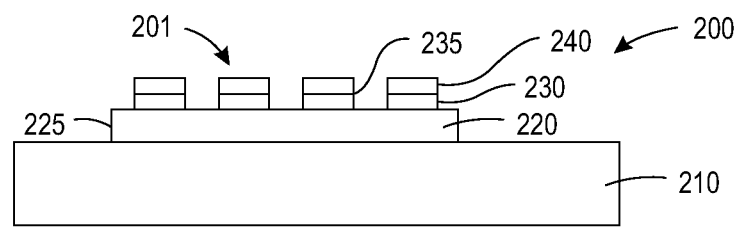

FIGS. 2A and 2B respectively show top and cross sectional views, respectively, of a field emission rectifier 200 wherein the dielectric layer 230 and the second metal layer 240 have a meandering peripheral edge 235. The rectifier 200 includes a substrate 210 having a first metal layer 220 disposed thereon. The first metal layer 220 has a peripheral edge 225. A patterned dielectric layer 230 is disposed on the first metal layer 220. A patterned second metal layer 240 is disposed on the dielectric layer 230 such that the dielectric layer 230 is sandwiched between the first metal layer 220 and the second metal layer 240.

As shown in FIGS. 2A and 2B, at least in the rectifying region 201 of the field emission rectifier 200, the second metal layer 240 may have substantially the same pattern as the dielectric layer 230. The pattern of the dielectric layer 230 and the second metal layer 240 produces a meandering edge 235 of the dielectric layer 230 and the second metal layer 240. The meandering edge 235 can extend substantially across the rectifier region 201. For example, the edge 235 may extend across at least 50% of the rectifier region 201. Electric field emission that occurs at the edge 235 of the second metal layer 240 provides high current across the short distance set by the thickness of the relatively thin dielectric 230. The field emission current is proportional to the total length of the edge of the second metal layer 240. The width, $w_m$, across the meandering pattern may be of less than about 100 nm in some embodiments. A total length of the edge 235 may be at least about 50%, at least about 75%, at least about 100%, at least about 150%, or even at least about 200% greater than a length of the peripheral edge 225 of the first metal layer 220 According to some embodiments, the total surface area of the first metal layer 220 can be at least 50% greater than a total surface area of the second metal layer 240.

The rectifier 200 includes macrostructures generally having micron-scale or greater dimensions such as the rectifier leads (not shown in FIGS. 2A and 2B) and outer dimensions of the first metal layer 220. The rectifier 200 includes nanostructures that are relatively small compared to the macrostructures, such as the patterned meandering dielectric layer 230 and second metal layer 240.

The substrate may comprise glass, polymer film such as PET or polycarbonate, ceramic, or other dielectric materials. The substrate may be relatively thick, of the order of 1 mm, or thin enough to be used in roll to roll processing, thickness of the order of 25 microns.

Referring now to the rectifiers 100, 200 of FIGS. 1A, 1B and FIGS. 2A, 2B, the first metal layer 120, 220 and/or the second metal layer 140, 240 may be or comprise any suitable metal or metal alloy, such as copper, aluminum, gold, silver, and/or alloys thereof. In some embodiments, the first metal layer 120, 220 may be or comprise the same metal or metal alloy as the second metal layer 140, 240. Alternatively, the metal or metal alloy of the first metal layer 120, 220 may differ from the metal or metal alloy of the second metal layer 140, 240.

The first 120, 220 and/or second metal layers 140, 240 may have a thickness in a range of 20 nm to 2 microns. In some embodiments, the thickness of the first metal layer 120, 220 is substantially the same as the thickness second metal layer 140, 340. Alternatively, the thicknesses of the first 120, 220 and second 140, 240 metal layers may differ.

It is preferable for the metals to be non-oxidizing. Such metals include the coinage metals including gold. Metal layers may also be composite wherein the thicker part provides lateral current transport and the surface layer is a metal which prevents oxidation.

The dielectric layer 130, 230 may comprise an oxide of the metal of the first metal layer and/or other dielectric materials. In some embodiments, the thickness, $t_d$, of the dielectric layer 130, 230 may range from about 2 nm to about 50 nm. For example, the thickness of the dielectric layer 130, 230 may be between about 2 nm to 10 nm or 5 nm to 20 nm. The dielectric layer can be deposited using atomic layer deposition, self-limited chemical reaction and/or other means to provide a low defect, uniform thickness dielectric.

Figure 3:
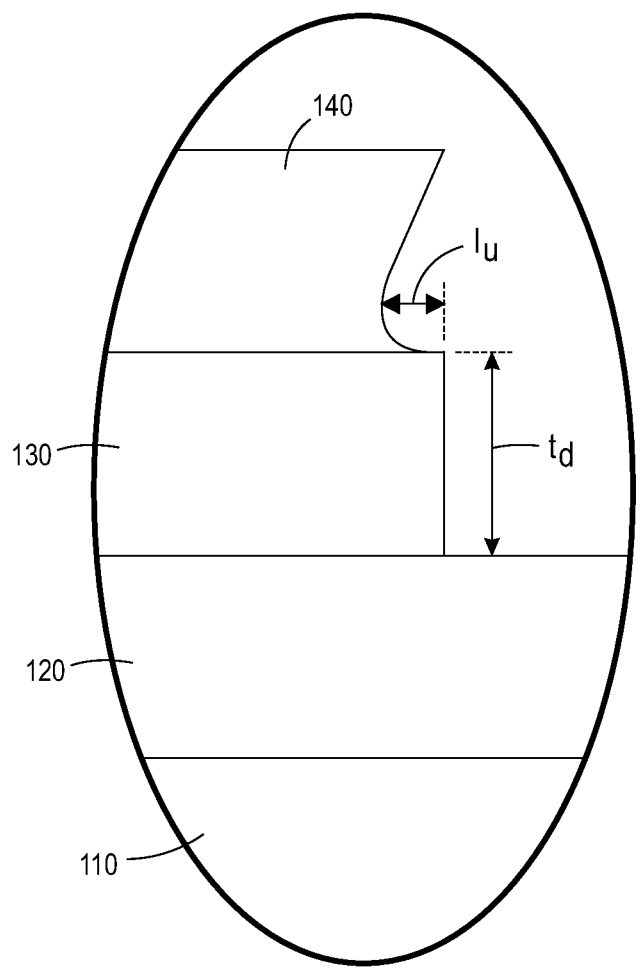
FIG. 3 depicts view of a cross sectional portion of the rectifier that exhibits undercutting by etching.

Referring now to FIG. 3, the nanostructured features, e.g., the holey and meandering structures shown in FIGS. 1A, 1B, 2A and 2B, can be formed by printing or otherwise depositing the layers 120, 130, 140 on the substrate 110 and subsequently etching the dielectric 130 and second metal layers 140. In one fabrication method, a holey structure having discrete regions where there are holes through the dielectric layer and the second metal layer, such as the rectifier 100 shown in FIGS. 1A and 1B, can be formed using an ink loaded with particles, e.g., having diameters of about 100 nm. A rectifier that provides very large current densities can be produced using printing technologies with particle-loaded ink to form the macrostructures. In a self-assembling approach, the pinhole providing ink can optionally be printed (either as an additive, subtractive, or lift-off process) after the device defining macroscopic field resist. The meander structure can be created directly by printing resist or developer, or, with much finer resolution, by using digital exposure, or fixed pattern, rolling masking.

In some circumstances, a wet or dry etching process may undercut the nanostructured features. FIG. 3 depicts view of a cross sectional portion 300 of the rectifier 100. Extensive undercutting of the second metal layer 140 can be detrimental to the operation of the rectifier, particularly in view of the very small dimensions of the nanostructured features. Parameters of the etching process may be selected to reduce the amount of undercutting. As shown in FIG. 3, in some implementations, the maximum amount of the undercutting, $l_u$, may be less than a thickness of the dielectric layer, $t_d$, as illustrated in FIG. 3.

Vertical metal-insulator-metal (MIM) structures as conceptually shown in FIGS. 1A, 1B and FIGS. 2A, 2B having a dielectric (insulator) layer on the order of about 5 nm thick can be used to make multi-GHz rectifiers that work in air. The macrostructures of the rectifiers 100, 200 lend themselves to fabrication by printing processes, such as jet printing, gravure printing, screen printing, soft lithography, etc. As previously discussed, field emission from the peripheral edges of the top metal layer provides high current across the short distance set by the thickness of the thin dielectric.

The rectifier current may be proportional to the total length of the peripheral edge 135, 136, 235 of the dielectric 130, 230 and second metal layers 140, 240. The "holey" (FIGS. 1A and 1B) and meandering (FIG. 2A and 2B) structures are configured to greatly increase the peripheral edge lengths of the second metal layer, thereby increasing the diode current per unit area.

Figure 4:
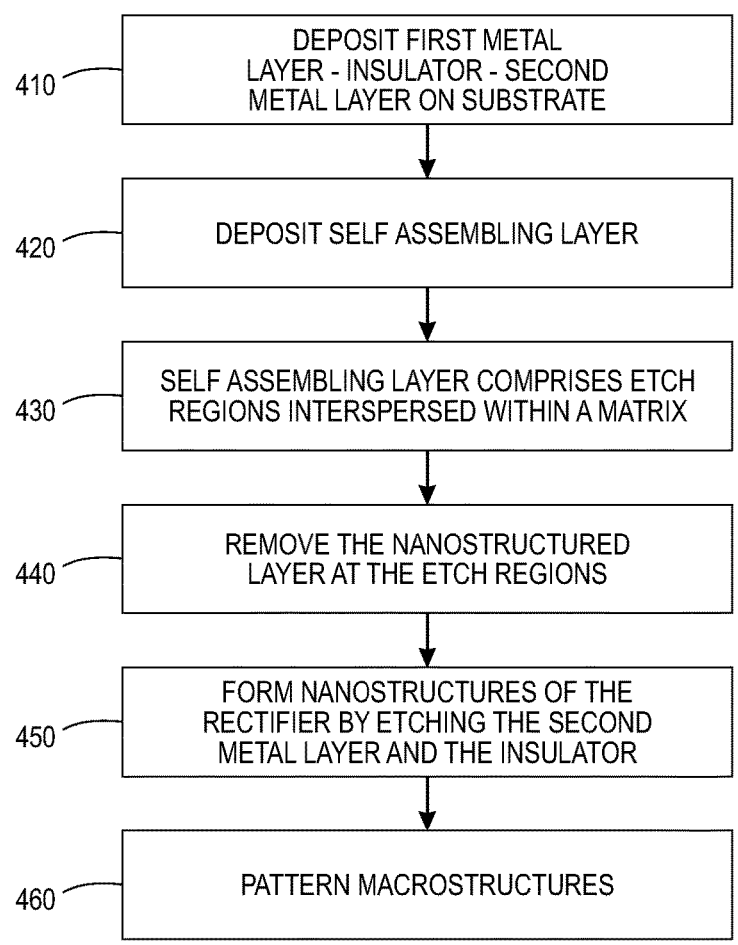
FIG. 4 is a flow diagram that outlines methods of making a rectifier structure in accordance with some embodiments.

The process flow diagrams of FIG. 4 outlines methods of making a rectifier structure in accordance with some embodiments. Fabrication 410 of the interim structure includes a first state of initial processing that involves sequentially depositing a first metal layer, an insulator layer, and a second metal layer on a substrate. In some embodiments, the first and second metal layers can be deposited by printing. An optional uniform resist layer or layers can be included to enable printing the macroscopic structures. Alternatively, the one or more resist layers can be printed in a patterned manner. For example, the first (lower) metal layer can be prepatterned to provide connections. After the lower metal layer is prepatterned to provide connections, the dielectric layer can be uniformally deposited or created. After the dielectric layer is created, the second (top) metal can be patterned, wherein the pattern optionally includes the top metal connections. Alternatively, the top metal connections may be provided in a later step. Following the patterning of the top metal, the holes are fabricated. The dielectric layer can be grown either by oxidation of the first metal layer, chemical vapor deposition of the dielectric layer, atomic layer deposition (ALD) of the dielectric layer and/or other processes.

A nanostructuring layer for nano-patterning the dielectric and second metal layers is deposited on the second metal layer. According to some embodiments, the nanostructuring layer may be deposited by printing. The nanostructuring layer self assembles 430 to form etch regions within a matrix. The nanostructuring layer is removed 440 at the etch regions, leaving intact holes in the matrix. In some embodiments, the nanostructuring layer is loaded with sacrificial particles, e.g., particles having an average diameter of less than about 100 nm, at a concentration such that the nanostructuring layer provides a monolayer of sacrificial particles surrounded by the matrix.

The second metal layer and dielectric are etched 450 through the etch regions. The macrostructures of the rectifier, such as perimeters of the first metal layer, dielectric layer, and second metal layer and/or the rectifier leads are patterned 460. The patterning of the macrostructures may occur before or after the nanostructures are formed.

Figure 5A:
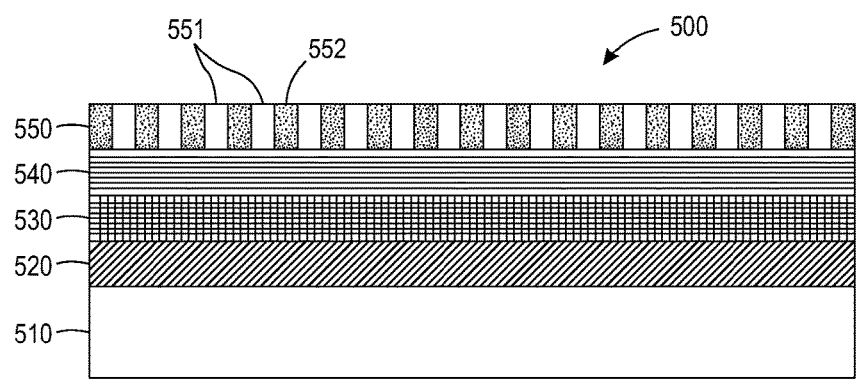
FIGS. 5A through 9B are cross sectional diagrams that illustrate the formation of a rectifier in accordance with embodiments disclosed herein.
Figure 5B:
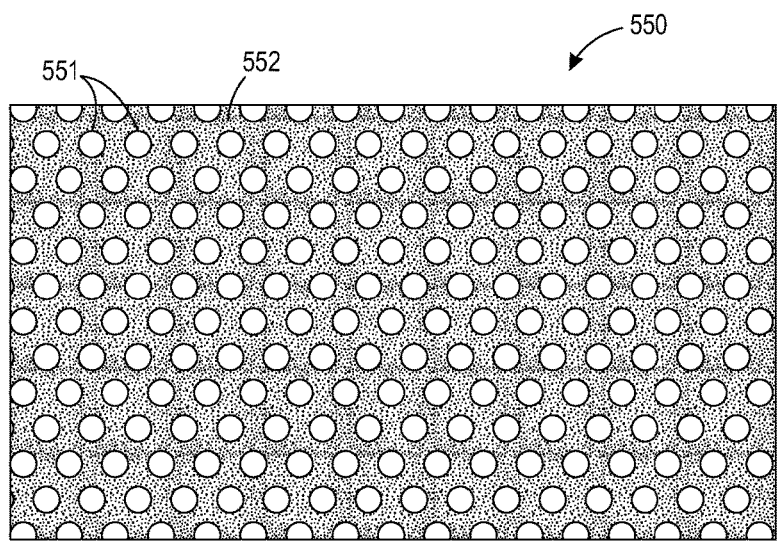
Figure 6:
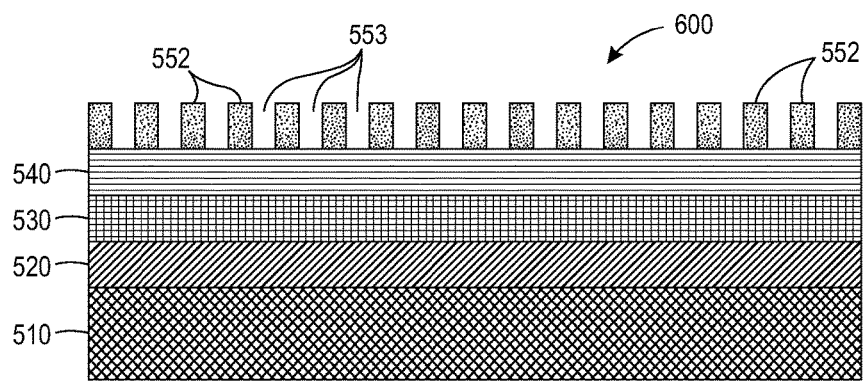
Figure 7:
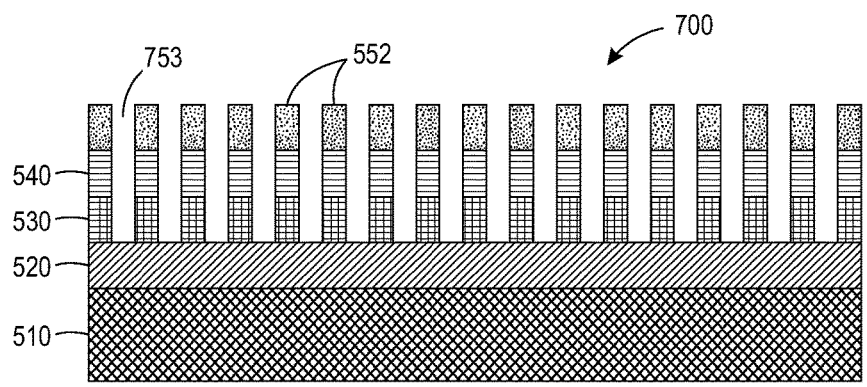
Figure 8:
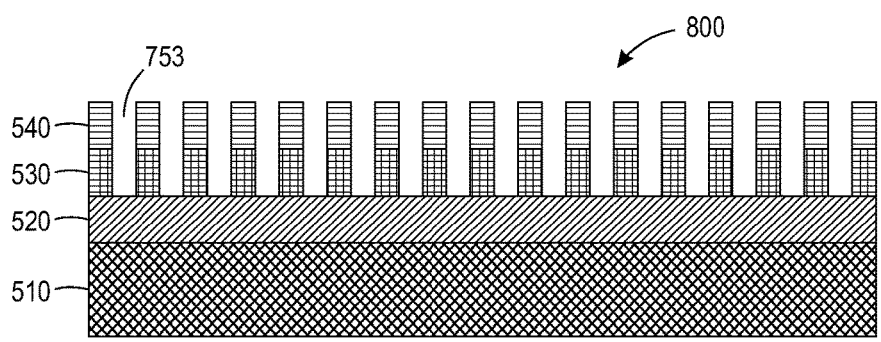
Figure 9A:
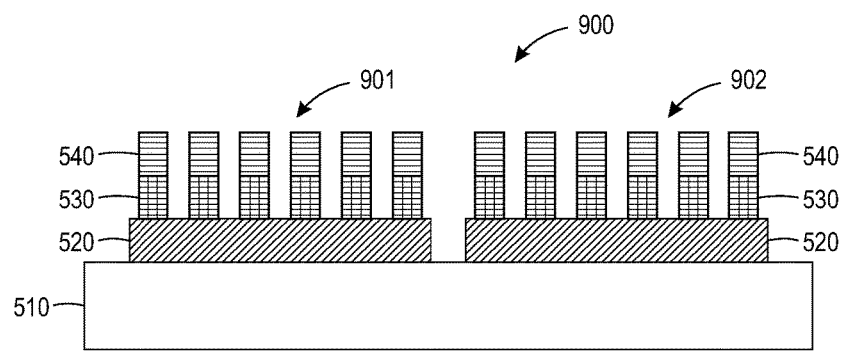
Figure 9B:
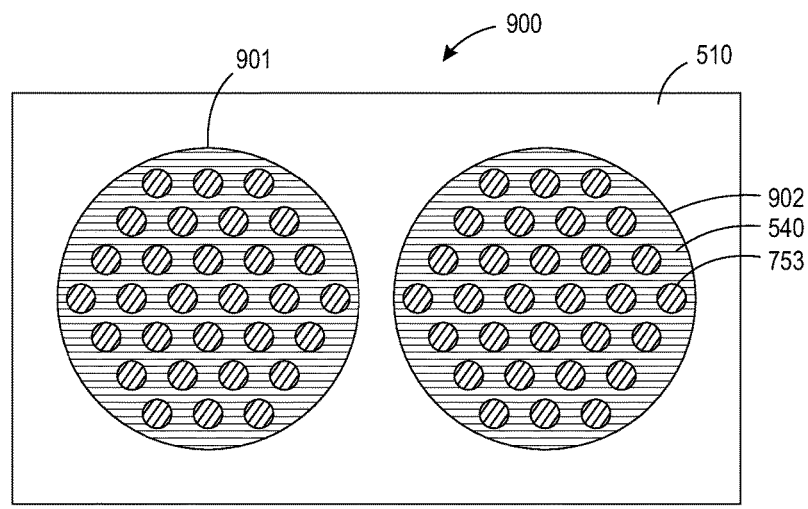

FIGS. 5A through 9B are cross sectional diagrams that illustrate the formation of a rectifier in accordance with embodiments disclosed herein. FIGS. 5A and 5B respectively show cross sectional and top views of a rectifier subassembly 500 after the sequential deposition of the first metal layer 520, insulator layer 530, second metal layer 540, and nanostructuring layer 550 on substrate 510. The nanostructuring layer 550 self assembles into etch regions 551 embedded in a matrix 552. FIG. 6 shows a rectifier subassembly 600 after removal of the etch regions leaving holes 553 in the matrix 552. FIG. 7 shows a rectifier subassembly 700 after the second metal layer 540 and the insulator layer 530 have been etched leaving holes 753 that have been etched to the first metal layer 520. FIG. 8 shows a rectifier subassembly 800 after the matrix 552 has been removed. FIGS. 9A and 9B respectively show cross sectional and top views of a rectifier subassembly 900 after macrostructures of two rectifier device regions 901, 902 have been patterned.

The macrostructures of the rectifier, e.g., electrical leads and/or peripheral edges of one or more of layers of the first metal layer—insulator—second metal layer sandwich, can be formed by printing to lay out the macrostructures of the first metal layer, dielectric layer, and/or second metal layer and/or by other techniques. In some embodiments, only printing technologies are used to form these macrostructures. In some embodiments, forming macrostructures may involve directly printing resist or developer, digital exposure of resist or developer, e.g., using a laser digital array, fixed pattern rolling, etc. In some embodiments, the rectifiers can be fabricated using printing technologies.

In some embodiments, layers 520-550 can be deposited by sequentially printing the layers on the substrate. Layers 520 through 540 form a the basic first metal layer 520-insulator layer 530-second metal layer 540 sandwich of the rectifier.

The nanostructuring layer 550 may comprise a block copolymer layer that includes hydrophilic or soluble components and hydrophobic or insoluble components. The hydrophilic and hydrophobic components are capable of organizing themselves into regions of hydrophilicity and hydrophobicity. The hydrophilic or soluble regions can be removed leaving the holes 553 in the nanostructuring layer interspersed with the hydrophobic matrix 552 as depicted in FIG. 6.

In some embodiments the nanostructuring layer 550 may comprise an ink having sacrificial particles, such a starch, contained therein. The particle-laden ink is printed onto the second metal layer 540. As illustrated in FIG. 5A, the nanostructured layer 550 self assembles to include particles 551 in a matrix 552. The nanostructuring layer 550 self assembles into particles 551 arranged in an etch resistant matrix 552. The particles 551 can be removed, for example by dissolution in water, leaving holes 553 in the etch resistant matrix 552, as shown in FIG. 6.

Unless otherwise indicated, all numbers expressing feature sizes, amounts, and physical properties used in the specification and claims are to be understood as being modified in all instances by the term "about." Accordingly, unless indicated to the contrary, the numerical parameters set forth in the foregoing specification and attached claims are approximations that can vary depending upon the desired properties sought to be obtained by those skilled in the art utilizing the teachings disclosed herein. The use of numerical ranges by endpoints includes all numbers within that range (e.g. 1 to 5 includes 1, 1.5, 2, 2.75, 3, 3.80, 4, and 5) and any range within that range.

Various modifications and alterations of the embodiments discussed above will be apparent to those skilled in the art, and it should be understood that this disclosure is not limited to the illustrative embodiments set forth herein. The reader should assume that features of one disclosed embodiment can also be applied to all other disclosed embodiments unless otherwise indicated. It should also be understood that all U.S. patents, patent applications, patent application publications, and other patent and non-patent documents referred to herein are incorporated by reference, to the extent they do not contradict the foregoing disclosure.

The invention claimed is:
1. An electronic field emission rectifier comprising:
a substrate;
a first metal layer disposed on the substrate and having a peripheral edge;
a dielectric layer having a pattern and disposed on the first metal layer; and a second metal layer disposed on and having the pattern of the dielectric layer, wherein the pattern produces one or more edges of the dielectric and second metal layers, and wherein a total length of the one or more edges of the dielectric and second metal layers is at least about 50% greater than a length of the peripheral edge of the first metal layer.

2. The device of claim 1, wherein the one or more edges of the dielectric and second metal layers comprises a meandering peripheral edge that extends substantially across a rectifier area of the device.

3. The device of claim 1, wherein the length of the edges of the dielectric and second metal layers is at least about 100% greater than the length of the peripheral edge of the first metal layer.

4. The device of claim 1, wherein the one or more edges of the dielectric and second metal layers comprises multiple discrete edges within an outer peripheral edge of the dielectric and second metal layers.

5. The device of claim 1, wherein the one or more edges of the dielectric and second metal layers include an outer peripheral edge that extends substantially across a rectifier area of the rectifier.

6. The device of claim 1, wherein the one or more edges of the dielectric and second metal layers define holes in the dielectric and second metal layers that are substantially circular.

7. The device of claim 6, wherein the substantially circular holes have an average diameter of less than about 100 nm.

8. The device of claim 1, wherein the dielectric layer comprises one or more of:
a deposited layer; and
an oxidized layer.

9. The device of claim 1, wherein the second metal layer is undercut by less than a thickness of the dielectric layer.

10. The device of claim 1, wherein the dielectric layer is about 2 nm to about 50 nm thick.

11. The device of claim 1, wherein one or more edges of the dielectric and second metal layers include multiple edges that define holes having an average diameter of less than about 100 nm in the dielectric and second metal layers and an outer peripheral edge of the dielectric and second metal layers.

12. An electronic field emission rectifier comprising:
a substrate;
a first metal layer disposed on the substrate and having a peripheral edge;
a dielectric layer having a pattern and disposed on the first metal layer; and
a second metal layer disposed on and having the pattern of the dielectric layer, wherein the pattern produces one or more edges of the dielectric and second metal layers, and wherein the one or more edges of the dielectric and second metal layers comprises a meandering peripheral edge that extends substantially across a rectifier area of the device.

13. The device of claim 12, wherein the dielectric layer comprises one or more of:
a deposited layer; and
an oxidized layer.

14. The device of claim 12, wherein the second metal layer is undercut by less than a thickness of the dielectric layer.

15. The device of claim 12, wherein the dielectric layer is about 2 nm to about 50 nm thick.

* * * * *